United States Patent [19]
Bae et al.

[11] Patent Number: 6,004,729
[45] Date of Patent: Dec. 21, 1999

[54] METHODS OF IMPROVING PHOTORESIST ADHESION FOR INTEGRATED CIRCUIT FABRICATION

[75] Inventors: Yong-Tae Bae; Do-Han Lee; Ho-Ki Kim, all of Kyunggi, Rep. of Korea

[73] Assignee: Samsung Electronics Co., Ltd., Rep. of Korea

[21] Appl. No.: 08/963,679

[22] Filed: Oct. 31, 1997

[30] Foreign Application Priority Data

Nov. 2, 1996 [KR] Rep. of Korea ............... 96-51680

[51] Int. Cl.⁶ .................................................. G03F 7/00
[52] U.S. Cl. .................. 430/317; 430/313; 430/327; 438/964; 438/974; 427/307
[58] Field of Search .................................. 430/313, 317, 430/311, 327; 216/38, 56; 438/974, 964; 427/307, 309

[56] References Cited

U.S. PATENT DOCUMENTS

| | | | |
|---|---|---|---|
| 4,176,003 | 11/1979 | Brower et al. ............... | 430/313 |
| 4,455,568 | 6/1984 | Shiota ............................ | 257/535 |
| 5,219,791 | 6/1993 | Freiberger .................... | 437/195 |
| 5,223,450 | 6/1993 | Fujino et al. ................. | 438/406 |
| 5,266,525 | 11/1993 | Morozumi ..................... | 437/195 |
| 5,320,932 | 6/1994 | Haraguchi et al. ........... | 430/313 |
| 5,405,489 | 4/1995 | Kim et al. ..................... | 156/643 |
| 5,413,953 | 5/1995 | Chien et al. .................. | 216/38 |
| 5,654,213 | 8/1997 | Choi et al. .................... | 438/227 |
| 5,672,907 | 9/1997 | Kasagi .......................... | 257/632 |

FOREIGN PATENT DOCUMENTS

| | | | |
|---|---|---|---|
| 280 633 A1 | 7/1990 | Germany . | |
| 91-136317 | 6/1991 | Japan . | |
| 6097159 | 4/1994 | Japan . | |
| 94-188242 | 7/1994 | Japan ............... | H01L 21/3205 |

*Primary Examiner*—Kathleen Duda
*Attorney, Agent, or Firm*—Myers Bigel Sibley & Sajovec

[57] ABSTRACT

A method of forming an integrated circuit device includes the steps of forming a conductive pattern on an integrated circuit device, and forming an insulating layer on the conductive pattern and on the integrated circuit substrate. An upper surface portion of the insulating layer opposite the substrate is removed, and a photoresist layer is formed on the insulating layer after the step of removing the upper surface portion. The photoresist layer is patterned, and exposed portions of the insulating layer are etched using the patterned photoresist layer as an etching mask thereby forming contact holes through the insulating layer.

30 Claims, 4 Drawing Sheets

METHODS OF IMPROVING PHOTORESIST ADHESION FOR INTEGRATED CIRCUIT FABRICATION

FIELD OF THE INVENTION

The present invention relates to the field of integrated circuits and more particularly to methods of patterning layers for integrated circuit structures.

BACKGROUND OF THE INVENTION

In many semiconductor devices, multi-layer metal interconnections are provided by separating the metal interconnection layers with insulating layers. The different metal interconnection layers can be connected using contact (or via) holes through the insulating layers.

FIGS. 1A through 1D illustrate steps of a method of forming contact holes through an insulating layer according to the prior art. As shown in FIG. 1A, a device isolation region 12 is formed on a semiconductor substrate 10 to define active and inactive regions of the substrate. An insulating layer 14 is formed and patterned to provide a contact hole 15 therethrough. A metal interconnection layer 16 is then deposited on the insulating layer 14 filling the contact hole 15. The metal interconnection layer 16 provides a lower metal interconnection layer.

An insulating layer 18 is then formed on the metal interconnection layer 16 and on the insulating layer 14 as shown in FIG. 1B. A second metal interconnection layer can later be formed on the insulating layer 18 so that the first and second insulating layers can be separated by the insulating layer 18. A photoresist layer 20 is deposited and patterned on the insulating layer 18 to provide an etch mask defining a contact hole to be etched through the insulating layer 18. A wet etch step is performed using the patterned photoresist layer 20 as a mask thus isotropically etching the insulating layer 18 as shown in FIG. 1C. The undercut a of the photoresist layer 20 may, however, be generated during this wet etch step.

A dry etching step can then be used to complete the contact hole 22 through the insulating layer 18 thus exposing portions of the metal interconnection layer 16 as shown in FIG. 1D. Again, the patterned photoresist layer 20 is used as an etch mask during the dry etch step. The photoresist layer 20 can then be removed, and a second metal interconnection layer can be formed on the insulating layer 18. Accordingly, the contact holes 22 can be used to provide interconnections between the first and second metal interconnection layers.

The undercut a illustrated in FIGS. 1C and 1D may occur, however, because of poor adhesion between the photoresist layer 20 and the insulating layer 18. For example, an etchant used during the wet etch step may penetrate along an interface between the photoresist layer and the insulating layer causing voids along the interface therebetween. Accordingly, even though the contact hole 22 is formed using wet and dry etching steps, the thickness of the insulating layer 18 may be significantly reduced adjacent the contact hole 22. An undesired step may thus be generated on the insulating layer 18 thereby degrading the insulation provided by the insulating layer 18 between upper and lower interconnection layers.

SUMMARY OF THE INVENTION

It is therefore an object of the present invention to provide improved methods of patterning layers for integrated circuit devices.

It is another object of the present invention to provide methods of increasing adhesion between photoresist and insulating layers.

It is still another object of the present invention to reduce the generation of voids between a photoresist layer and a layer being etched.

These and other objects are provided according to the present invention by methods including the steps of forming a conductive pattern on an integrated circuit substrate, and forming an insulating layer on the conductive pattern and on the integrated circuit substrate. More particularly, an upper surface portion of the insulating layer opposite the substrate is removed, and a photoresist layer is formed on the insulating layer after the step of removing the upper surface portion. By removing the upper surface portion of the insulating layer, a surface roughness thereof can be increased thereby increasing adhesion between the insulating layer and the photoresist layer. This increased adhesion can reduce undercutting of the photoresist layer during subsequent steps of etching contact holes in the insulating layer.

More particularly, the insulating layer can have a thickness of approximately 1,000 Angstroms, and the removing step can include removing less than 500 Angstroms of the insulating layer and preferably removing approximately 300 Angstroms of the insulating layer. These thicknesses provide adequate insulation between insulating layers while maintaining adequate adhesion between the photoresist layer and the insulating layer. Moreover, the insulating layer can be a layer of a phosphorous silicate glass (PSG) or an undoped oxide (UDO).

The removing step can include etching the upper surface portion of the insulating layer. More particularly, the upper surface portion of the insulating layer can be etched with an etchant solution including a mixture of deionized water and HF. A ratio of the deionized water to the HF is preferably less than approximately 2000:1.

The adhesion between the photoresist layer and the insulating layer can be further increased by forming a thin oxide layer on the insulating layer before forming the photoresist layer. More particularly, the thin oxide layer can be formed by performing an $H_2O_2$ treatment or an $O_2$ plasma treatment on the insulating layer. Moreover, the removing step can be followed by the step of drying the insulating layer before forming the photoresist layer.

In addition, the step of forming the conductive pattern can be preceded by the step of forming a second insulating layer on the integrated circuit substrate, and the conductive pattern can be a patterned metal layer. The method can also include the steps of patterning the photoresist layer, etching exposed portions of the insulating layer using the patterned photoresist layer as an etching mask to form contact holes through the insulating layer, and removing the patterned photoresist layer.

According to the methods of the present invention, adhesion between an insulating layer and a photoresist layer can be increased by removing a surface portion of the insulating layer. The generation of voids between the insulating layer and the photoresist layer can thus be reduced during a subsequent step of etching the insulating layer. Improved contact holes can thus be provided between metal interconnection layers.

DETAILED DESCRIPTION

Figure 1A:
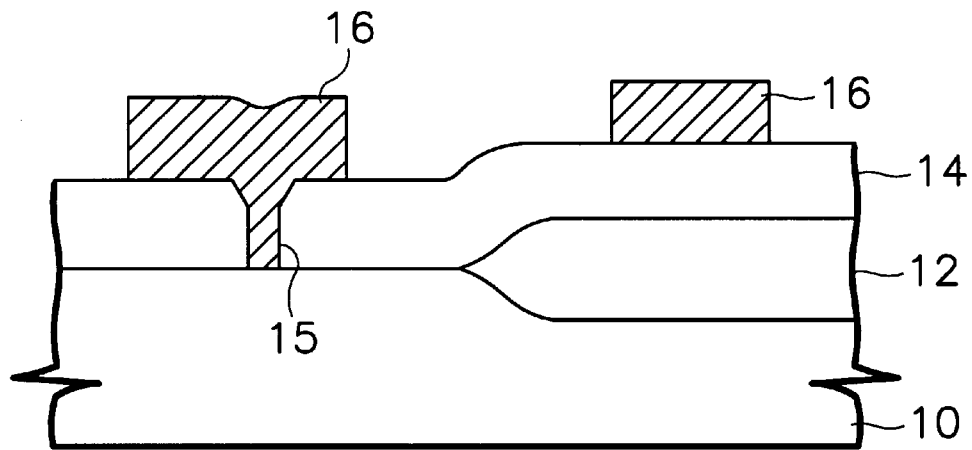
FIGS. 1A through 1D are cross-sectional views illustrating steps of a method of forming an integrated circuit device according to the prior art.
Figure 1B:
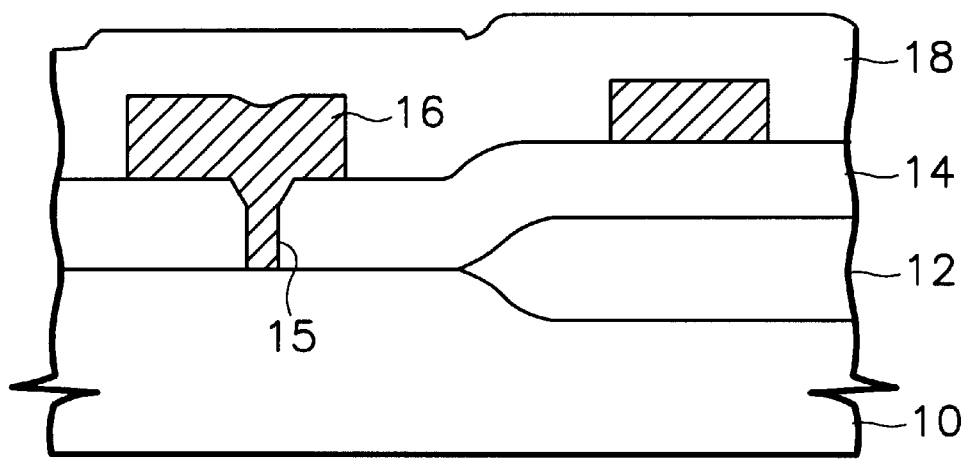
Figure 1C:
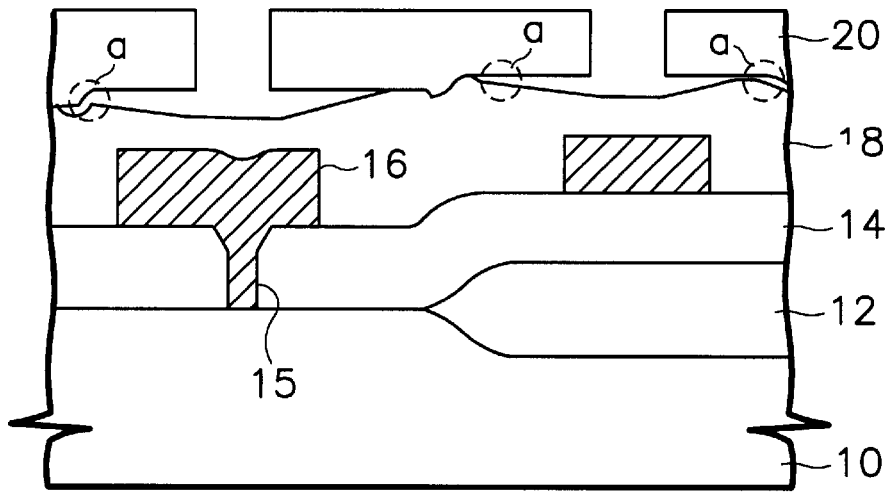
Figure 1D:
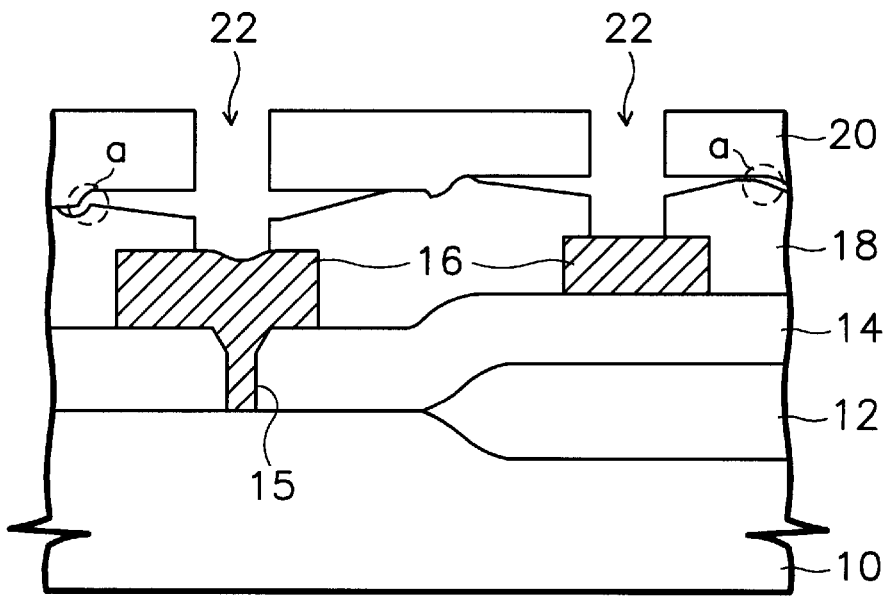

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

A method of patterning an insulating layer according to the present invention includes the step of removing an upper surface portion of the insulating layer before depositing a photoresist layer thereon. As discussed in greater detail below, this step can be used to improve adhesion between the photoresist layer and the insulating layer. More particularly, an insulating layer can be formed on a semiconductor substrate, and an upper surface portion of the insulating layer can be removed using a dilute hydrofluoric (HF) solution. The removal of the upper surface portion of the insulating layer can increase adhesion between the insulating layer and a photoresist layer formed thereon. This increased adhesion may result because surface roughness of the insulating layer can be increased while removing the upper surface portion using the dilute HF solution. The photoresist layer can thus be patterned to provide an etch mask when forming contact (via) holes through the insulating layer. In particular, the increased adhesion can reduce undercutting of the photoresist layer when using a wet etch step to form the contact holes.

Figure 2A:
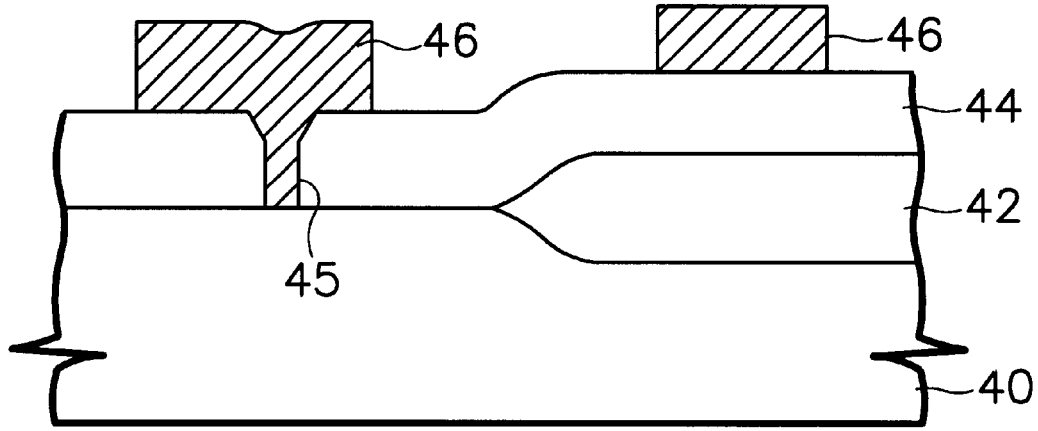
FIGS. 2A through 2D are cross-sectional views illustrating steps of a method of forming an integrated circuit device according to the present invention.

A method of forming an integrated circuit device according to the present invention will now be discussed in greater detail with reference to FIGS. 2A through 2D. As shown in FIG. 2A, a device isolation region 42 is formed on a semiconductor substrate 40 thus defining active and inactive regions of the substrate. An insulating layer 44 such as a silicon oxide layer is formed on the semiconductor substrate 40 and the device isolation region 42, and this insulating layer 44 is patterned using photolithographic mask and etch steps to provide the contact hole 45. A metal interconnection layer 46 is deposited on the insulating layer 44 filling the contact hole 45 as shown. The metal interconnection layer 46 can be used as a lower metal interconnection layer in an integrated circuit device having multiple layers of metal layer connections.

Figure 2B:
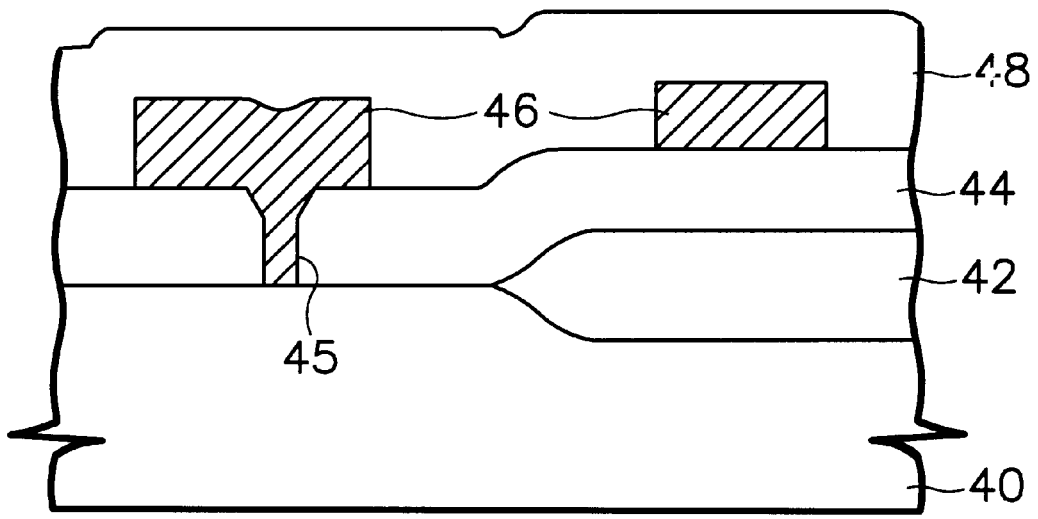

A second insulating layer 48 such as a phosphorus silicate glass (PSG) layer or an undoped oxide (UDO) layer is formed on the metal interconnection layer 46 and on the insulating layer 44 as shown in FIG. 2B. The insulating layer 44 can be formed by chemical vapor deposition to provide electrical insulating between the metal interconnection layer 46 and a later formed interconnection layer. The interlayer insulating layer 48 can have a thickness of in the range of approximately 1,000 Angstroms to 1,500 Angstroms.

Figure 2C:
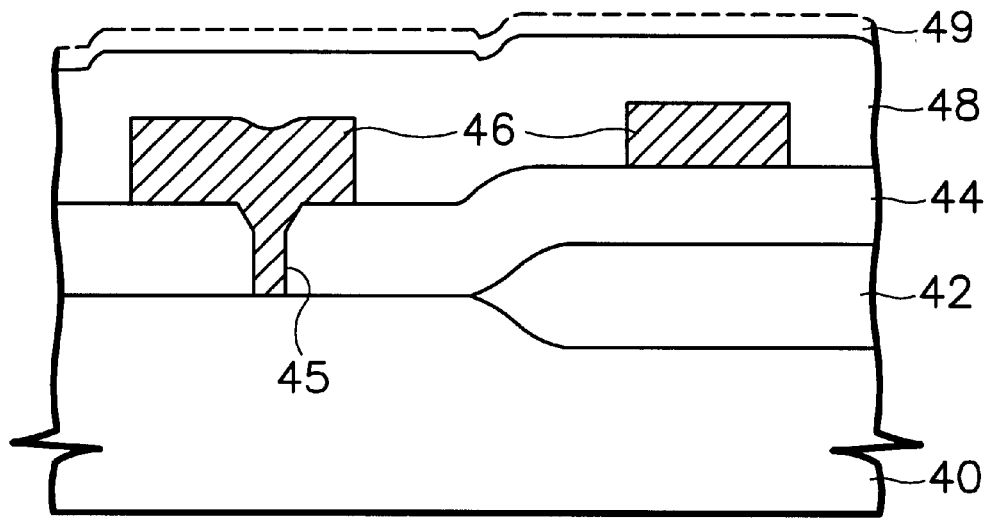

An upper surface portion 49 (shown with dashed line) of the insulating layer 48 can be removed using a dilute HF solution as shown in FIG. 2C. The dilute HF solution can be a mixture of a hydrofluoric solution and deionized water. A relatively high ratio of deionized water to HF solution may provide a uniform thickness of the insulating layer. If the ratio is too high, however, the etch time may be undesirably lengthened. The ratio of the deionized water to the HF solution is thus preferably less than about 2000:1. The ratio is more preferably in the range of approximately 200:1 to 100:1. In addition, the thickness of the upper surface portion 49 of the insulating layer 48 which is removed is preferably in the range of approximately 200 Angstroms to 500 Angstroms, and more preferably approximately 200 Angstroms.

As discussed above, the roughness of the insulating layer 48 can be increased by removing a surface portion thereof using a dilute HF solution. Accordingly, a photoresist layer can be formed on the insulating layer 48 having the increased surface roughness thereby increasing the adhesion between the insulating layer 48 and a subsequently formed photoresist layer. The photoresist layer can thus be used to provide an etch mask during a wet etch step to form a contact hole while reducing penetration of the etchant along the interface between the insulating layer 48 and the photoresist layer 50. Accordingly, the increased adhesion reduces the formation of voids at the interface between the insulating layer 48 and the photoresist layer 50.

After removing the upper surface portion 49 of the insulating layer 48, an $O_2$ plasma treatment or a $H_2O_2$ treatment of the insulating layer 48 can be performed to form a relatively thin oxide film on the insulating layer 48. This oxide film can be used to further improve the adhesion between the insulating layer 48 and the photoresist layer. In addition to the surface treatment of the insulating layer 48, a bake step can be performed to dry the surface of the insulating layer prior to formation of the photoresist layer.

Figure 2D:
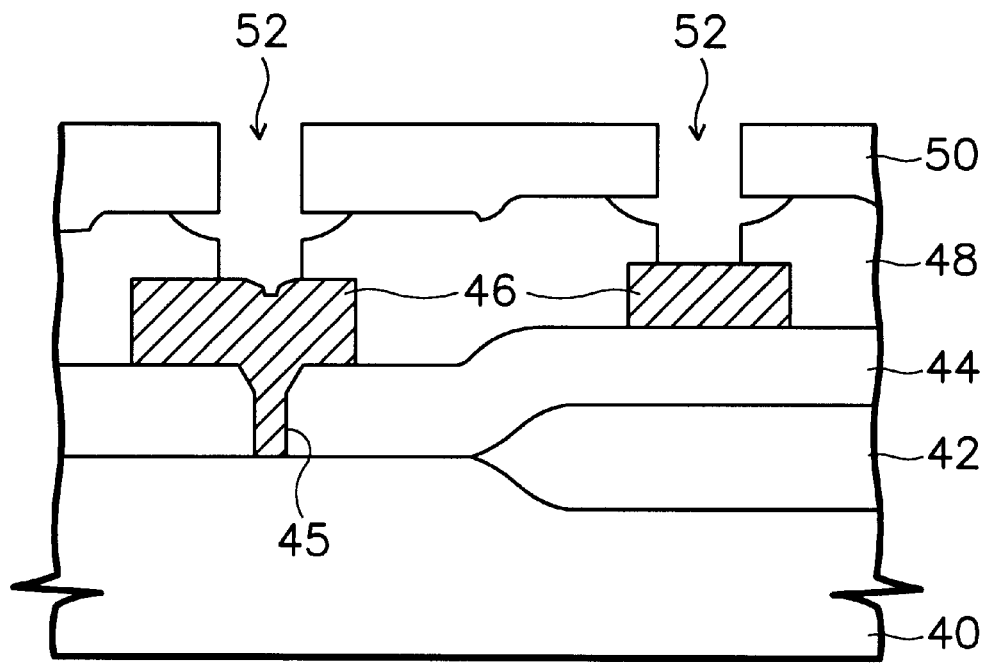

A photoresist layer 50 is then deposited on the insulating layer 48 and patterned to define contact (via) holes 52 to be formed in the insulating layer 48. Wet and dry etch steps can then be sequentially performed using the patterned photoresist layer 50 as an etch mask thus forming the contact (via) holes 52 through the insulating layer 48 as shown in FIG. 2D. As shown, each of the contact holes 52 can expose a portion of the metal interconnection layer 46.

The photoresist layer 50 can then be removed, and a second metal interconnection layer can be formed on the insulating layer 48. This upper metal interconnection layer can fill the contact holes 52 to provide electrical connection between the lower metal interconnection layer 46 and the upper metal interconnection layer. A multi-layer interconnection structure can thus be formed on the semiconductor substrate 40 wherein electrical connections are provided between the metal interconnection layers through the contact holes 52.

As discussed above, a dilute HF solution can be used to remove a surface portion of an insulating layer prior to forming a photoresist layer thereon. The removal of the surface portion of the insulating layer can increase a surface roughness thereof thereby increasing adhesion between the photoresist layer and the insulating layer. The photoresist layer can then be patterned to provide an etch mask, and exposed portions of the insulating layer can be etched using wet and dry etch steps to provide a contact hole through the insulating layer. Accordingly, undercutting of the photoresist layer during wet etch steps can be reduced around the contact hole because of the increased adhesion between the photoresist layer and the insulating layer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating an integrated circuit device, said method comprising the steps of:

forming a conductive pattern on an integrated circuit substrate;

forming an insulating layer on said conductive pattern and on said integrated circuit substrate;

increasing a surface roughness of said insulating layer opposite said substrate by removing an upper surface portion of said insulating layer opposite said substrate; and forming a photoresist layer on said insulating layer after said step of increasing the surface roughness of said insulating layer by removing said upper surface portion.

2. A method according to claim 1 wherein said removing step comprises etching said upper surface portion of said insulating layer.

3. A method according to claim 1 wherein said insulating layer is formed having a thickness in the range of 1000 Angstroms to 1,500 Angstroms.

4. A method according to claim 3 wherein said removing step comprises removing in the range of 200 Angstroms to 500 Angstroms of said insulating layer.

5. A method according to claim 4 wherein said removing step comprises removing 200 Angstroms of said insulating layer.

6. A method according to claim 1 wherein said insulating layer comprises one of a phosphorus silicate glass (PSG) layer or an undoped oxide (UDO) layer.

7. A method according to claim 1 wherein said step of increasing the surface roughness of said insulating layer by removing said upper surface portion comprises etching said insulating layer with an etchant solution comprising a mixture of de-ionized water and HF before forming the photoresist layer.

8. A method according to claim 7 wherein a ratio of said deionized water to said HF is less than 2000:1.

9. A method according to claim 1 wherein said removing step is followed by the step of:

forming a thin oxide layer on said insulating layer before said step of forming said photoresist layer.

10. A method according to claim 9 wherein said oxide forming step comprises performing an $H_2O_2$ treatment on said insulating layer.

11. A method according to claim 9 wherein said oxide forming step comprises performing an $O_2$ plasma treatment on said insulating layer.

12. A method according to claim 7 wherein said removing step is followed by the step of:

drying said insulating layer before said step of forming said photoresist layer.

13. A method according to claim 1 wherein said step of forming said conductive pattern is preceded by the step of:

forming a lower insulating layer on said integrated circuit substrate.

14. A method according to claim 1 wherein said conductive pattern comprises a patterned metal layer.

15. A method according to claim 1 further comprising the steps of:

patterning said photoresist layer;

etching exposed portions of said insulating layer using said patterned photoresist layer as an etching mask thereby forming contact holes through said insulating layer; and removing said patterned photoresist layer.

16. A method of forming an integrated circuit device, said method comprising the steps of:

forming a conductive pattern on an integrated circuit substrate;

forming an insulating layer on said conductive pattern and on said integrated circuit substrate;

increasing a surface roughness of said insulating layer opposite said substrate by removing an upper surface portion of said insulating layer opposite said substrate;

forming a photoresist layer on said insulating layer after said step of increasing the surface roughness of said insulating layer by removing said upper surface portion;

patterning said photoresist layer; and etching exposed portions of said insulating layer using said patterned photoresist layer as an etching mask thereby forming contact holes through said insulating layer.

17. A method according to claim 16 wherein said etching step comprises wet etching said insulating layer and dry etching said insulating layer.

18. A method according to claim 16 wherein said removing step comprises etching said upper surface portion of said insulating layer.

19. A method according to claim 16 wherein said insulating layer is formed having a thickness in the range of 1000 Angstroms to 1,500 Angstroms.

20. A method according to claim 19 wherein said removing step comprises removing in the range of 200 Angstroms to 500 Angstroms of said insulating layer.

21. A method according to claim 20 wherein said removing step comprises removing 200 Angstroms of said insulating layer.

22. A method according to claim 16 wherein said insulating layer comprises one of a phosphorus silicate glass (PSG) layer or an undoped oxide (UDO) layer.

23. A method according to claim 16 wherein said step of increasing the surface roughness of said insulating layer by removing said upper surface portion comprises etching said insulating layer with an etchant solution comprising a mixture of de-ionized water and HF before forming the photoresist layer.

24. A method according to claim 23 wherein a ratio of said de-ionized water to said HF is less than 2000:1.

25. A method according to claim 16 wherein said removing step is followed by the step of:

forming a thin oxide layer on said insulating layer before said step of forming said photoresist layer.

26. A method according to claim 25 wherein said oxide forming step comprises performing an $H_2O_2$ treatment on said insulating layer.

27. A method according to claim 25 wherein said oxide forming step comprises performing an $O_2$ plasma treatment on said insulating layer.

28. A method according to claim 23 wherein said removing step is followed by the step of:

drying said insulating layer before said step of forming said photoresist layer.

29. A method according to claim 16 wherein said step of forming said conductive pattern is preceded by the step of:

forming a lower insulating layer on said integrated circuit substrate.

30. A method according to claim 16 wherein said conductive pattern comprises a patterned metal layer.

* * * * *